(12) United States Patent
Nouvel

(10) Patent No.: US 8,154,225 B2
(45) Date of Patent: Apr. 10, 2012

(54) CONTROL DEVICE FOR AN ULTRASONIC PIEZOELECTRIC ACTUATOR

(75) Inventor: Clement Nouvel, Verneuil sur Seine (FR)

(73) Assignee: Renault S.A.S., Boulogne Billancourt (FR)

( * ) Notice: Subject to any disclaimer, the term of this patent is extended or adjusted under 35 U.S.C. 154(b) by 433 days.

(21) Appl. No.: 12/444,325

(22) PCT Filed: Sep. 26, 2007

(86) PCT No.: PCT/FR2007/052014
§ 371 (c)(1),
(2), (4) Date: Jun. 24, 2009

(87) PCT Pub. No.: WO2008/047018
PCT Pub. Date: Apr. 24, 2008

(65) Prior Publication Data
US 2010/0033116 A1    Feb. 11, 2010

(30) Foreign Application Priority Data
Oct. 16, 2006   (FR) ..................................... 06 09043

(51) Int. Cl.
*H01L 41/04*   (2006.01)
(52) U.S. Cl. ........................ 318/116; 310/319
(58) Field of Classification Search .................. 318/116; 310/319, 8.1; 331/113; 340/600
See application file for complete search history.

(56) References Cited

U.S. PATENT DOCUMENTS

| 5,036,263 | A | 7/1991 | Yamada et al. |
| 5,986,360 | A | 11/1999 | Gerken et al. |
| 2007/0227507 | A1 | 10/2007 | Gotzenberger |
| 2009/0243433 | A1 * | 10/2009 | Dirr et al. ..................... 310/319 |

FOREIGN PATENT DOCUMENTS

| FR | 2 767 355 | 2/1999 |
| JP | 4 309273 | 10/1992 |
| WO | 2005 121534 | 12/2005 |

OTHER PUBLICATIONS

U.S. Appl. No. 13/124,335, filed Apr. 14, 2011, Nouvel.
U.S. Appl. No. 13/166,675, filed May 26, 2011, Nouvel, et al.
U.S. Appl. No. 12/936,454, Oct. 5, 2010, Nouvel, et al.

* cited by examiner

*Primary Examiner* — Karen Masih
(74) *Attorney, Agent, or Firm* — Oblon, Spivak, McClelland, Maier & Neustadt, L.L.P.

(57) ABSTRACT

A control device for an ultrasonic piezoelectric actuator including a first stage supplied by a DC voltage source and including a mechanism forming a second DC voltage above that voltage delivered by the DC voltage source, and a second stage including a mechanism amplifying the second voltage and chopping the voltage obtained by excitation of the actuator with the chopped voltage, under control of a computer. The amplifying mechanism includes an inductor in electrical resonance with the piezoelectric actuator. The inductor is connected to the first stage so as to constitute, during formation of the second voltage, a secondary winding of a transformer forming part of a flyback voltage converter introduced into the first stage to develop the second voltage. The control device may find application to control of a fuel injector in an internal combustion engine.

10 Claims, 1 Drawing Sheet

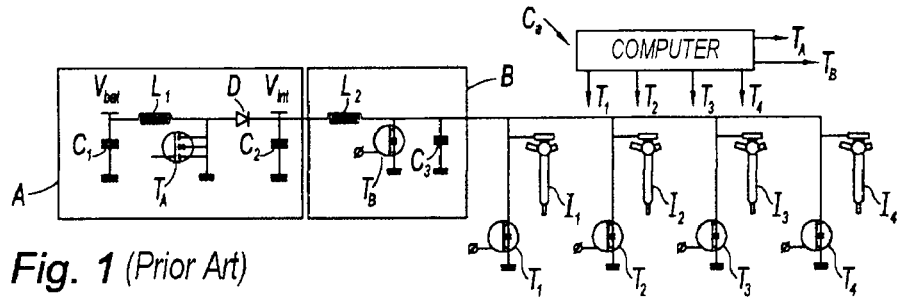
*Fig. 1 (Prior Art)*
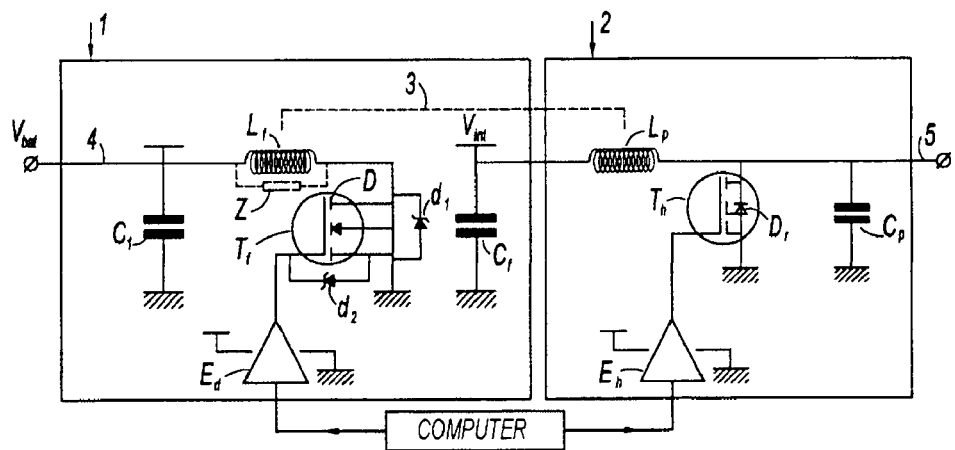
*Fig. 2*      *Fig. 2a*
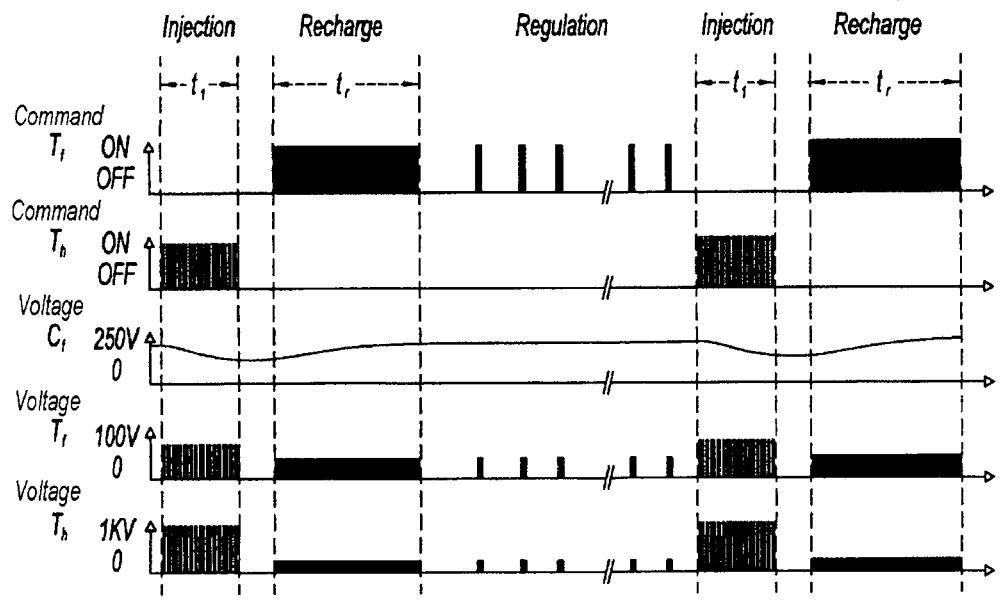
*Fig. 3*

CONTROL DEVICE FOR AN ULTRASONIC PIEZOELECTRIC ACTUATOR

The present invention relates to a control device for controlling at least one piezoelectric actuator driven by a computer, comprising a first stage powered by a direct voltage source and provided with means for forming a second direct voltage greater than that delivered by this source, and a second stage provided with means for amplifying this second voltage and for chopping the voltage obtained in order to excite the actuator with the chopped voltage, under the control of the computer, these amplification means comprising an inductor that electrically resonates with the piezoelectric actuator.

A device of this type is known from the European patent application number 1 422 764 filed in the name of the applicant, hereafter called the previously cited patent. This known device is designed to provide excitation of an ultrasonic piezoelectric actuator incorporated in a fuel injector for an internal combustion engine. It is shown diagrammatically in FIG. 1 of the appended drawing. As shown in this figure, it comprises a first stage A powered by the battery of a vehicle propelled by this engine, which battery establishes a voltage Vbat over a capacitor $C_1$ placed at the input to this stage. The latter takes the form of a switched mode power supply of the "boost" type, in the terminology of the person skilled in the art, conventionally comprising an inductor $L_1$, a switching transistor $T_A$, a diode D and an output capacitor $C_2$. A computer Ca which manages the time the fuel injectors $I_i$ (i from 1 to 4) are open also controls the duty cycle of conduction by the transistor $T_A$ so as to establish a direct voltage Vint at the terminals of a filter capacitor $C_2$. The level of this voltage is intermediate between that of the battery (commonly 12 volts) and that required to excite the piezoelectric actuators incorporated in the injectors $I_i$ (commonly around 1 kilovolt). This voltage Vint powers a second stage B comprising an inductor $L_2$ calculated to resonate electrically with the capacitor of each injector $I_i$ so that the output voltage from this stage reaches the aforementioned kilovolt at a matching capacitor $C_3$. A chopper transistor $T_B$, also controlled by the aforementioned computer, cuts off the output voltage from the stage A at the ultrasonic frequency required by the piezoelectric actuators during the times the injectors are open determined by this computer. The sequential turning on of the injector $I_i$ selected is also ensured by the computer, which to this end controls the conduction of a transistor $T_i$ associated with this injector. Reference should be made to the aforementioned patent for more details about the structure and the operation of this known device. It follows from the preceding description that this device comprises two separate inductive elements $L_1$ and $L_2$ the size and cost of which may be significant within the electronic injection system associated with the engine. The present invention has precisely the aim of providing a control device for piezoelectric actuators, which can in particular be integrated in fuel injectors for an internal combustion engine, in which device these problems are eliminated or at least minimized.

This aim of the invention, along with others which will appear in the remainder of the present description, is attained by a control device for at least one piezoelectric actuator driven by a computer, comprising a first stage powered by a direct voltage source and provided with means for forming a second direct voltage greater than that delivered by this source, and a second stage provided with means for amplifying the second direct voltage and for chopping the voltage obtained in order to excite the actuator with the chopped voltage, under the control of the computer, these amplification means comprising an inductor that electrically resonates with the piezoelectric actuator, this device being noteworthy in that this inductor is connected to the first stage so as to constitute, during the formation of the second direct voltage, the secondary winding of a transformer forming part of a flyback voltage converter introduced into the first stage in order to develop the second direct voltage.

As will be seen in greater detail in the following, the two inductors used in the device according to the invention are wound around the same core and not around two different cores, which makes it possible to attain the aim announced above.

According to other features of the present invention:
the flyback converter comprises a switching transistor in series with the primary winding of the transformer, an output capacitor under the intermediate voltage (Vint) and a rectifying diode, the rectifying diode consisting of a freewheeling diode associated with a transistor forming part of the means for chopping the amplified voltage;
the freewheeling diode is integrated in the transistor;
the transistor is a MOSFET transistor;
the device comprises means for limiting overvoltage on the primary of the transformer;
the device comprises means for regulating the intermediate voltage available at the terminals of the capacitor;
the device comprises means for inhibiting simultaneous operation of the first and second stages;
since in the control of a plurality of fuel injectors in an internal combustion engine the injectors are each equipped with an ultrasonic piezoelectric actuator, the device comprises means for sequentially exciting the actuators with the chopped voltage delivered by the second stage;
the switching frequency chosen for the flyback converter of the first stage is separated by at least 1 kHz from the resonant frequency of the piezoelectric actuators that equip the fuel injectors.

Further features and advantages of the present invention will become apparent on reading the following description and on examining the appended drawing, in which:

FIG. 1 schematically represents a device of the prior art, described in the preamble of the present invention;

FIG. 2 schematically represents the structure of the first and second stages of the device according to the present invention, designed to be substituted for the corresponding stages in the device of FIG. 1;

FIG. 2a illustrates a detail from FIG. 2; and

FIG. 3 represents a set of time charts used for the description of the operation of the device according to the invention.

Reference will be made to FIG. 2 of the appended drawing in order to describe the structure of the first and second stages of the device according to the invention, which are substituted for stages A and B respectively of the device known from the previously cited patent and represented in FIG. 1. It is in this way that this first stage 1 and this second stage 2 are inserted in the surroundings of an internal combustion engine propelling a motor vehicle for example. In this situation, the first stage is supplied with electrical energy by the battery (not shown) of the vehicle, which delivers to it a voltage Vbat, for example of around 12 volts. The control of stages 1 and 2 is provided by a computer C, which manages the operation of fuel injectors installed downstream of the second stage, just as those shown in FIG. 1. The sequential excitation of these injectors is carried out as described above in connection with this figure and as explained in more detail in the previously cited patent. The following description therefore concentrates on the structure and the operation of the first and second stages of the device according to the invention, as the reader is able to refer to the previously cited patent for the rest.

The first stage of the device according to the invention generally takes the form of a switched mode power supply of the type well known to the person skilled in the art by the name of a flyback converter. This converter comprises a transformer comprising a primary winding $L_f$ and a secondary winding $L_p$, wound around the same ferrite core shown diagrammatically by the broken line numbered 3.

The first winding, or inductor, $L_f$ is placed in series with the conduction circuit of a transistor $T_f$, advantageously a MOSFET transistor, between a line 4 connected to the vehicle battery and ground. The conduction of this transistor, a switching transistor, is controlled by high-frequency signals coming from the computer C via a control stage $E_d$. The capacitor $C_1$ located at the input to the stage 1, between the line 4 and ground, plays the same role as the corresponding capacitor of the known device of FIG. 1.

According to one feature of the device according to the invention, the secondary winding consists of an inductor $L_p$ that is also used within the second stage but, as will be seen below, at a different time.

It is known that in a flyback converter the energy stored in the magnetic core (made of ferrite) is transferred into a capacitor connected between the terminals of the secondary winding, here the capacitor $C_f$, through a blocking diode, the position of which will be given further below. It is at the terminals of this capacitor $C_f$ that the intermediate voltage Vint is taken, which is formed by the first stage 1 from the voltage Vbat delivered by the vehicle battery. This intermediate voltage is advantageously between 50 and 300 volts.

The second stage 2 is similar, in its structure, to the corresponding stage B of the known device of FIG. 1. Thus it comprises an inductor $L_p$ connected between the terminal at the intermediate voltage Vint of the capacitor $C_f$ and the drain D of a transistor $T_h$, a MOSFET transistor for example, the source of which is grounded, the conduction of this transistor itself also being controlled by the computer C via a control stage $E_h$.

As has been seen further above, this inductor $L_p$ is, however, distinguished from the independent inductor $L_2$ of the stage B of the known device of FIG. 1 in that it is constituted by the secondary winding of the transformer ($L_f$, 3, $L_p$) that forms part of the flyback converter integrated into the first stage 1.

Apart from this essential difference, from which the present invention benefits, as will be seen further below, the second stage 2 of the device according to the invention functions substantially as does that of the known device. Thus, this stage amplifies the intermediate voltage Vint in order to deliver a voltage with a peak reaching the level required in order to excite the piezoelectric actuators, namely 1 kilovolt for example, this voltage being chopped at the ultrasonic frequency, also required, by suitable control of the transistor $T_h$ developed by the computer C.

As described in the previously cited patent, which may be referred to for more detail on this point, this amplification is obtained due to an oscillating circuit formed by the inductor $L_p$ and the capacitor of each actuator, this inductor $L_p$ being dependent on the acoustic excitation resonance of the actuator. The chopped high voltage is delivered to the piezoelectric actuator of the selected injector by an output line 5 from the second stage 2, connected to the point common to the inductor $L_p$ and the drain of the transistor $T_h$. A matching capacitor $C_p$ is connected between the line 5 and ground in order to play the same role as the capacitor $C_3$ of the known device of FIG. 1.

Before moving onto the description of the operation of the device according to the invention, we return to a point signaled above and which remains to be specified, namely the position of the rectifying diode that must be present in the flyback converter of the first stage of this device. As is well known to the person skilled in the art, current MOSFET transistors are normally equipped with a freewheeling diode such as the diode $D_r$ of the transistor $T_h$ from the second stage of the device according to the invention. According to the present invention, in the coupling described above of stages 1 and 2, this freewheeling diode $D_r$ takes on the rectifying function of the flyback converter.

Reference will now be made to the time charts of FIG. 3 in order to describe the operation of the control device according to the invention, in its application to the control of fuel injectors in an internal combustion engine, these injectors being equipped with ultrasonic piezoelectric actuators. These time charts illustrate the evolutions of the "on/off" commands of the transistors $T_f$ and $T_h$ respectively and the evolutions of the voltages at the terminals of the capacitor $C_f$ and the drain-source circuits of the transistors $T_f$ and $T_h$ respectively.

The periods in which the transistor $T_h$ is active and chopped correspond to the times of fuel injection $t_i$ as determined by the computer C. The periods in which the transistor $T_f$ is active and switched correspond to the times of storing energy in the inductor $L_f$ or recharge times $t_r$. Comparing the time charts for the "on/off" commands of the transistors $T_f$ and $T_h$ makes it clear that the periods of activity of these two transistors never overlap. This is what, according to a feature of the present invention, makes possible the shared use of the inductor $L_p$ by the two stages 1 and 2, even though the functions of these two stages are different.

The voltage elevation taken care of by the first stage is carried out by switching the current supplying the primary $L_f$ of the transformer ($L_f$, 3, $L_p$) by means of high-frequency switching (for example around 100 kHz or more) of the transistor $T_f$ between its off and on states, controlled by the computer C. This switching is carried out with an adjustable duty cycle, also determined by this computer, as is well known in the control of a flyback converter. As the transistor is switched on the primary charges and as this transistor is subsequently abruptly switched off the energy stored in the primary passes into the secondary $L_p$ of the transformer. The capacitor $C_f$ then recovers this energy through the freewheeling diode $D_r$ of the transistor $T_h$ of the second stage.

The charging or recharging of the capacitor $C_f$ extends for as long as the voltage at the terminals of this capacitor do not reach a suitable predetermined value such as Vint=250 volts, for example, as is apparent on the graph of this voltage shown in FIG. 3.

As is also apparent in this figure, between two successive injection times $t_i$, maintaining the intermediate voltage at this level may require the presence of specific regulation means for appropriately reactivating the switching carried out by the transistor $T_f$ of the flyback converter of the first stage 1 of the device according to the invention. In this way a possible partial discharge of the capacitor $C_f$ is compensated for. These regulation means may comprise a sensor for the voltage to be monitored at the terminals of the capacitor $C_f$ and a regulator sensitive to the signal delivered by this sensor in order to control the excitation by switching the transistor $T_f$ so as to bring the voltage Vint back to its set value. The installation of such regulation means does not pose any difficulty to the person skilled in the art and therefore does not require a more complete description in the context of the present patent application.

As seen further above, during recharging of the capacitor $C_f$ the transistor $T_h$ from the second stage 2 remains off. It is obviously the same during the time dedicated to regulating the charging of this capacitor.

During a command to inject fuel for a time $t_i$ determined by the computer C, the latter keeps the transistor $T_f$ from the first stage 1 off and activates, with chopping, the transistor $T_h$ from the second stage 2. The latter then functions substantially as the second stage of the device described in the previously cited patent, which should therefore be referred to for a detailed description of this functioning. The transformer is then used as a simple inductor $L_p$ (the first winding $L_f$ then having a very high impedance between its terminals) electrically resonating with the piezoelectric actuator of the injector selected by the computer C. Thus the high voltage (around 1 kilovolt) is obtained, chopped at the ultrasonic frequency (40-50 kHz, for example) necessary for the excitation of this piezoelectric actuator.

As is apparent in the time charts of FIG. 3, in the injection phase the transistor $T_f$ is subjected to a chopped voltage of around 100 volts, reduced in relation to that (1 kV) borne by the transistor $T_h$ due to the transformation ratio of the transformer. In the phase of recharging the capacitor $C_f$, the chopped voltages borne by the transistors $T_f$ and $T_h$ are around 50 and 250 volts respectively. The drain-source, or collector-emitter, isolation characteristics of these transistors should enable them to endure these voltage levels.

It follows from the preceding that the computer is duly programmed to control the transistors $T_f$ and $T_h$ so as to inhibit simultaneous operation of the first and second stages of the device according to the invention. Despite the precautions taken, interference such as the unintentional control of an injector during a phase of recharging the output capacitor of the flyback converter cannot be excluded (a voltage peak during recharging may suffice to activate an injector).

According to the present invention, a first solution to this problem consists in programming the computer so that no load (injector or compensation capacitor) is connected during the voltage elevation carried out by the first stage of the device.

Another solution consists in using very different switching and chopping frequencies, separated by at least 1 kHz. This is clearly the case for the frequencies indicated above by way of example (100 kHz switching and 40-50 kHz chopping). An improvement of this solution consists in using a switching frequency separated by more than 1 kHz from the resonant frequencies of the injectors and their harmonics.

A particular feature of the device according to the present invention applies to the fact that the design of the transformer of the flyback converter from the first stage must obviously take account of the value that the inductor $L_p$ of its secondary winding must have when it is involved in the oscillating circuit constituting the second stage. Solely by way of illustrative example, this inductance may be between 40 µH and 500 µH. In order to fix the transformation ratio of the transformer, the conventional rule is applied according to which, in a flyback stage, this ratio is linked to the ratio of the input voltage Vbat and the output voltage Vint of the stage by the equation:

$$Vint = M \cdot \alpha \cdot Vbat$$

With $\alpha=0.5$ to a first approximation. Thus the value of M is obtained, which is equal to the transformation ratio and therefore to the ratio of the number of turns of the primary and secondary windings.

In addition, the primary of the transformer must be protected against overvoltages resulting from the use of the flyback mode of operation by the first stage of the device according to the invention. To do this, as shown in FIG. 2, it is possible to protect the transistor $T_f$ using a Zener diode $d_1$ mounted in antiparallel between the drain and the source of this transistor and using another Zener diode $d_2$ mounted conducting from the source to the gate of the transistor. It is also possible, as shown in broken lines in FIG. 2, to position a circuit Z in parallel with the primary winding $L_f$. As illustrated by FIG. 2a, this circuit may comprise two diodes mounted head-to-tail in series, one being a Zener diode. It may also consist of a resistor and a capacitor in series, a diode being mounted in parallel with the resistor. These protection means are of types well known to the person skilled in the art, who will be able to design them without difficulties. It is, however, necessary to watch out so as not to clip the signals that appear on the primary of the transformer during a fuel injection phase. This might indeed deteriorate the performance of the device due to a reduction in the load on the primary of the transformer. Thus, the Zener diode $d_1$, see FIG. 2, may have a Zener voltage lower than the maximum voltage observed on the primary in the injection phase.

It is now apparent that the invention indeed enables the announced aim to be attained, namely to provide a control device for ultrasonic piezoelectric actuators of size and cost minimized by the fact that the two windings $L_f$ and $L_p$ are wound on the same ferrite core, whereas the two windings used in the device according to the previously cited patent are wound on different cores.

The transformer of the device according to the invention furthermore establishes galvanic isolation, improving safety, between the two stages of this device, which isolation did not exist in the device of the previously cited patent.

Equally, in the first stage of the device according to the invention it is possible to install a transistor with a lower isolation voltage than that located in the corresponding stage of the device of the previously cited patent. In the latter a transistor with an isolation voltage of 600 volts, proportional to the intermediate voltage, is typically installed. In the device according to the invention, the transistor $T_f$ must bear the battery voltage Vbat and the return of the voltage of the secondary during injection commands. As the latter voltage is lower, of around 50 volts, the isolation voltage necessary for $T_f$ may be of only around 150 volts. A transistor $T_f$ can therefore be chosen that is made in a technology guaranteeing better efficiency of the first stage.

Of course, the invention is not limited to the embodiment described and shown, which has been provided only by way of example. Thus, it is possible to use transistors in the invention other than the MOSFET type, for example IGBT transistors. Equally, the invention is not limited to the control of fuel injectors and extends to the control of piezoelectric actuators in general and, more generally still, to high-voltage alternating control, in particular for control frequencies less than 500 kHz.

The invention claimed is:

1. A control device for at least one piezoelectric actuator driven by a computer, comprising:
   a first stage powered by a direct voltage source and that includes means for forming a second direct voltage greater than a voltage delivered by the direct voltage source; and
   a second stage including means for amplifying the second direct voltage and means for chopping the amplified second direct voltage obtained to excite the actuator with the chopped voltage, under control of the computer, the means for amplifying comprising an inductor that electrically resonates with the piezoelectric actuator, wherein the inductor is connected to the first stage so as to constitute, during formation of the second voltage, a secondary winding of a transformer forming part of a flyback voltage converter introduced into the first stage to develop the second direct voltage.

2. The device as claimed in claim 1, wherein the flyback converter comprises a switching transistor in series with a primary winding of the transformer, an output capacitor under the second direct voltage, and a rectifying diode, wherein the rectifying diode includes a freewheeling diode associated with a transistor forming part of the means for chopping the amplified voltage.

3. The device as claimed in claim 2, wherein the freewheeling diode is integrated in the switching transistor.

4. The device as claimed in claim 3, wherein the switching transistor is a MOSFET transistor.

5. The device as claimed in claim 2, further comprising means for limiting overvoltage on the primary winding of the transformer.

6. The device as claimed in claim 2, further comprising means for regulating the second direct voltage available at the terminals of the capacitor.

7. The device as claimed in claim 1, further comprising means for inhibiting simultaneous operation of the first and second stages.

8. Use of the device as claimed in claim 1, to control a plurality of fuel injectors in an internal combustion engine, the injectors each comprising an ultrasonic piezoelectric actuator, the device comprising means for sequentially exciting the actuators with the chopped voltage delivered by the second stage.

9. Use as claimed in claim 8, wherein a switching frequency chosen for the flyback converter of the first stage is separated by at least 1 kHz from a resonant frequency of the piezoelectric actuators that equip the fuel injectors.

10. The use as claimed in claim 9, wherein the switching frequency is further separated by at least 1 kHz from harmonics of the resonant frequency.

* * * * *